United States Patent
Lee et al.

(10) Patent No.: US 12,027,390 B2
(45) Date of Patent: Jul. 2, 2024

(54) APPARATUS AND METHOD FOR TREATING SUBSTRATE

(71) Applicant: SEMES CO., LTD., Chungcheongnam-do (KR)

(72) Inventors: Sung Yong Lee, Gyeonggi-do (KR); Donghyuk Seo, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 428 days.

(21) Appl. No.: 16/931,733

(22) Filed: Jul. 17, 2020

(65) Prior Publication Data
US 2021/0020478 A1    Jan. 21, 2021

(30) Foreign Application Priority Data
Jul. 19, 2019    (KR) .................. 10-2019-0087512

(51) Int. Cl.
*H01L 21/67* (2006.01)

(52) U.S. Cl.
CPC .. *H01L 21/67248* (2013.01); *H01L 21/67109* (2013.01); *H01L 21/67173* (2013.01)

(58) Field of Classification Search
CPC ......... H01L 21/67103; H01L 21/67109; H01L 21/67173; H01L 21/67178; H01L 21/67184; H01L 21/67248; H01L 21/68742
USPC ...................................... 219/444.1
See application file for complete search history.

(56) References Cited

U.S. PATENT DOCUMENTS

| | | | |
|---|---|---|---|
| 2005/0115945 A1 | 6/2005 | Kesteren et al. | |
| 2005/0267606 A1* | 12/2005 | Bartlett | G05D 23/1931 700/29 |
| 2013/0270250 A1* | 10/2013 | Pease | H05B 1/0233 219/443.1 |
| 2018/0088066 A1* | 3/2018 | Schmidt | H05B 3/28 |
| 2019/0139805 A1* | 5/2019 | Muneishi | H01L 21/67103 |

FOREIGN PATENT DOCUMENTS

| | | |
|---|---|---|
| CN | 108376658 A | 8/2018 |
| JP | 2002506279 A | 2/2002 |
| JP | 2002151235 A | 5/2002 |
| JP | 2008034685 A | 2/2008 |
| KR | 10-2009-0045857 A | 5/2009 |
| KR | 10-2015-0046251 A | 4/2015 |
| KR | 1020160103664 A | 9/2016 |
| KR | 1020190030783 A | 3/2019 |
| TW | 201405691 A | 2/2014 |

OTHER PUBLICATIONS

Korean Patent Office. Korean Notice of Allowance Mailed May 12, 2022. Korean Patent Application No. 9-5-2022-035250218. Korean Language only. 2 pages.

* cited by examiner

*Primary Examiner* — Sang Y Paik
(74) *Attorney, Agent, or Firm* — Procopio, Cory, Hargreaves & Savitch LLP

(57) ABSTRACT

An apparatus for treating a substrate includes a housing having a treatment space therein, a heating plate that supports the substrate in the treatment space and that has a plurality of heating members inside, and a temperature control unit that controls the plurality of heating members to heat the substrate supported on the heating plate, in which the temperature control unit controls the plurality of heating members using a plurality of control signals with different control periods.

6 Claims, 12 Drawing Sheets

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0087512 filed on Jul. 19, 2019, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus and method for controlling temperatures for respective regions of a substrate.

Various processes, such as photolithography, etching, deposition, ion implantation, cleaning, and the like, are performed to manufacture semiconductor elements. Among these processes, the photolithography process for forming a pattern plays an important role in achieving high density integration of the semiconductor elements.

The photolithography process includes a coating process, an exposing process, and a developing process, and a bake process is performed before and after the exposing process. The bake process is a process of performing heat treatment on a substrate. When the substrate is placed on a heating plate, the substrate is subjected to heat treatment through a heating member provided inside the heating plate.

In the related art, for effective substrate temperature control, the heating plate is divided into a plurality of temperature control regions, and temperatures are controlled for the respective regions of the heating plate. However, as resistance values vary depending on the areas of the temperature control regions, temperature changes for respective regions of the substrate differ from one another when the substrate is heated by the heating plate after being loaded. That is, due to the variation in the resistance values depending on the areas of the temperature control regions of the heating plate, power (thermal energy) per unit area may vary. Therefore, a temperature difference may be generated even though the same power is applied to each of the temperature control regions.

SUMMARY

Embodiments of the inventive concept provide a substrate treating apparatus and method for controlling regions of a heating plate with different control periods.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an exemplary embodiment, an apparatus for treating a substrate includes a housing having a treatment space therein, a heating plate that supports the substrate in the treatment space and that has a plurality of heating members inside, and a temperature control unit that controls the plurality of heating members to heat the substrate supported on the heating plate, in which the temperature control unit controls the plurality of heating members using a plurality of control signals with different control periods.

The heating plate may include a central region and an edge region surrounding the central region. The plurality of heating members may include a first heating member provided in the central region and a second heating member provided in the edge region. The temperature control unit may include a first controller that controls the first heating member and a second controller that controls the second heating member and that has a control period different from a control period of the first controller.

The control period of the first controller may be shorter than the control period of the second controller.

The temperature control unit may further include a temperature measurement member that measures temperatures for the respective regions of the heating plate.

The temperature control unit may further include a power supply that supplies power to the plurality of heating members and a switching member that controls connection between the power supply and the first and second controllers, based on the temperatures measured by the temperature measurement member.

The first controller and the second controller may be provided such that the control periods thereof are variable.

The control periods of the first controller and the second controller may be changed to be shorter in a dynamic section in which temperature changes measured by the temperature measurement member exceed a preset range.

The control periods of the first controller and the second controller may be changed to be longer in a static section in which temperature changes measured by the temperature measurement member are below a preset range.

The heating plate may include a central region, an edge region surrounding the central region, and a middle region located between the central region and the edge region. The plurality of heating members may include a third heating member provided in the central region, a fourth heating member provided in the middle region, and a fifth heating member provided in the edge region. The temperature control unit may include a third controller that controls the third heating member, a fourth controller that controls the fourth heating member, and a fifth controller that controls the fifth heating member. Control periods of the third heating member, the fourth heating member, and the fifth heating member may differ from one another.

The control period of the third controller may be shorter than the control period of the fourth controller, and the control period of the fourth controller may be shorter than the control period of the fifth controller.

The apparatus may be an apparatus that performs a bake process.

According to an exemplary embodiment, a heating unit includes a heating plate that supports a substrate and that has a plurality of heating members inside and a temperature control unit that controls the plurality of heating members to heat the substrate supported on the heating plate, in which the temperature control unit controls the plurality of heating members using a plurality of control signals with different control periods.

The heating plate may include a central region and an edge region surrounding the central region. The plurality of heating members may include a first heating member provided in the central region and a second heating member provided in the edge region. The temperature control unit may include a first controller that controls the first heating member and a second controller that controls the second heating member and that has a control period different from a control period of the first controller.

The control period of the first controller may be shorter than the control period of the second controller.

The temperature control unit may include a temperature measurement member that measures temperatures for respective regions of the heating plate.

According to an exemplary embodiment, a substrate treating method for heating a substrate supported on a heating plate in a substrate treating apparatus including the heating plate having a plurality of heating members inside and a temperature measurement member that measures temperatures for respective regions of the heating plate includes heating the substrate supported on the heating plate, based on the temperatures measured by the temperature measurement member, in which the plurality of heating members are controlled by using a plurality of control signals with different control periods.

A control period of a control signal supplied to a first heating member provided in a central region of the heating plate may be shorter than a control period of a control signal supplied to a second heating member provided in an edge region surrounding the central region.

The control periods of the plurality of control signals supplied to the plurality of heating members may be changed to be shorter in a dynamic section in which temperature changes measured by the temperature measurement member exceed a preset range.

The control periods of the plurality of control signals supplied to the plurality of heating members may be changed to be longer in a static section in which temperature changes measured by the temperature measurement member are below a preset range.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
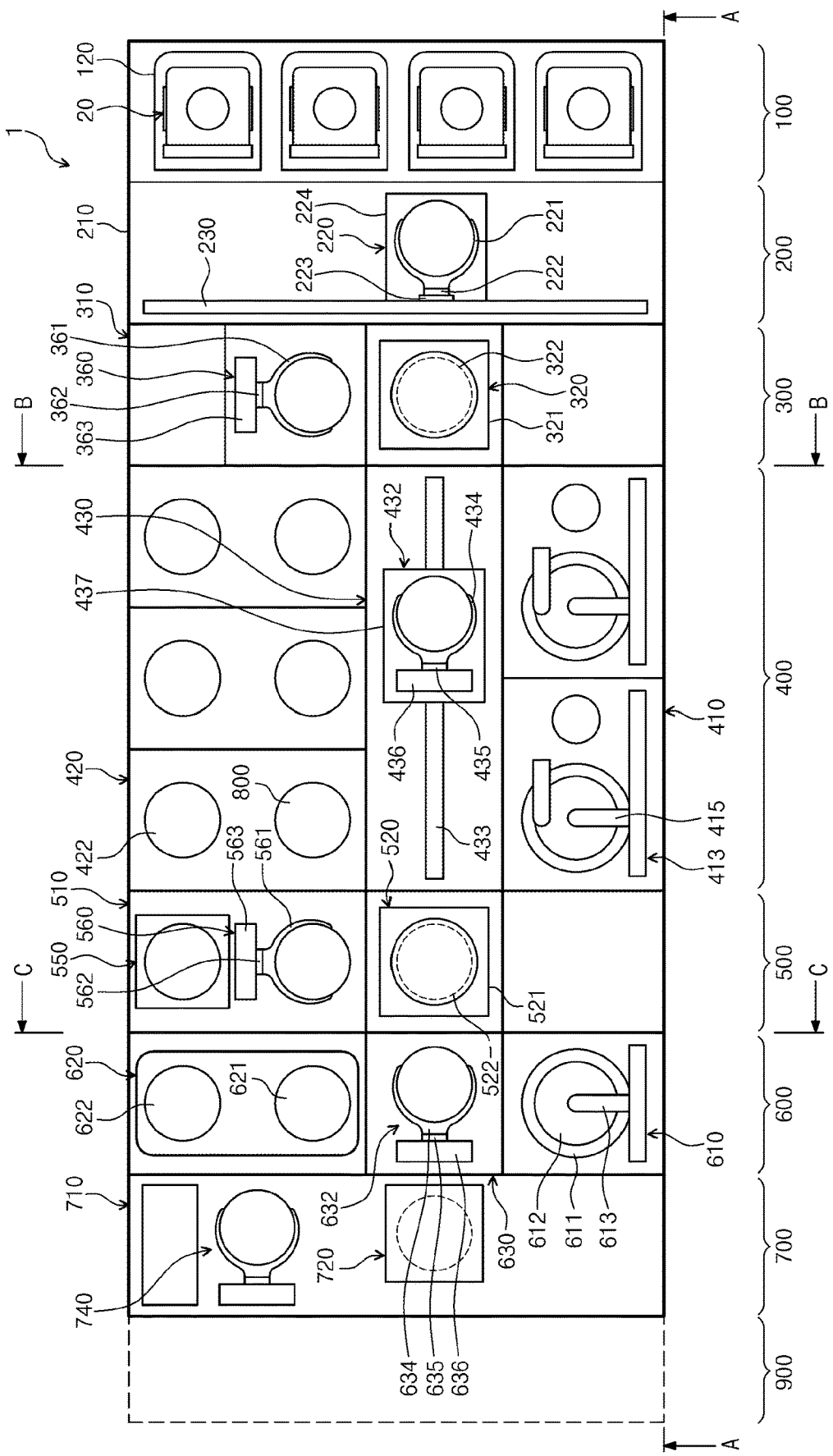
FIG. 1 is a top view illustrating substrate treating equipment.
Figure 2:
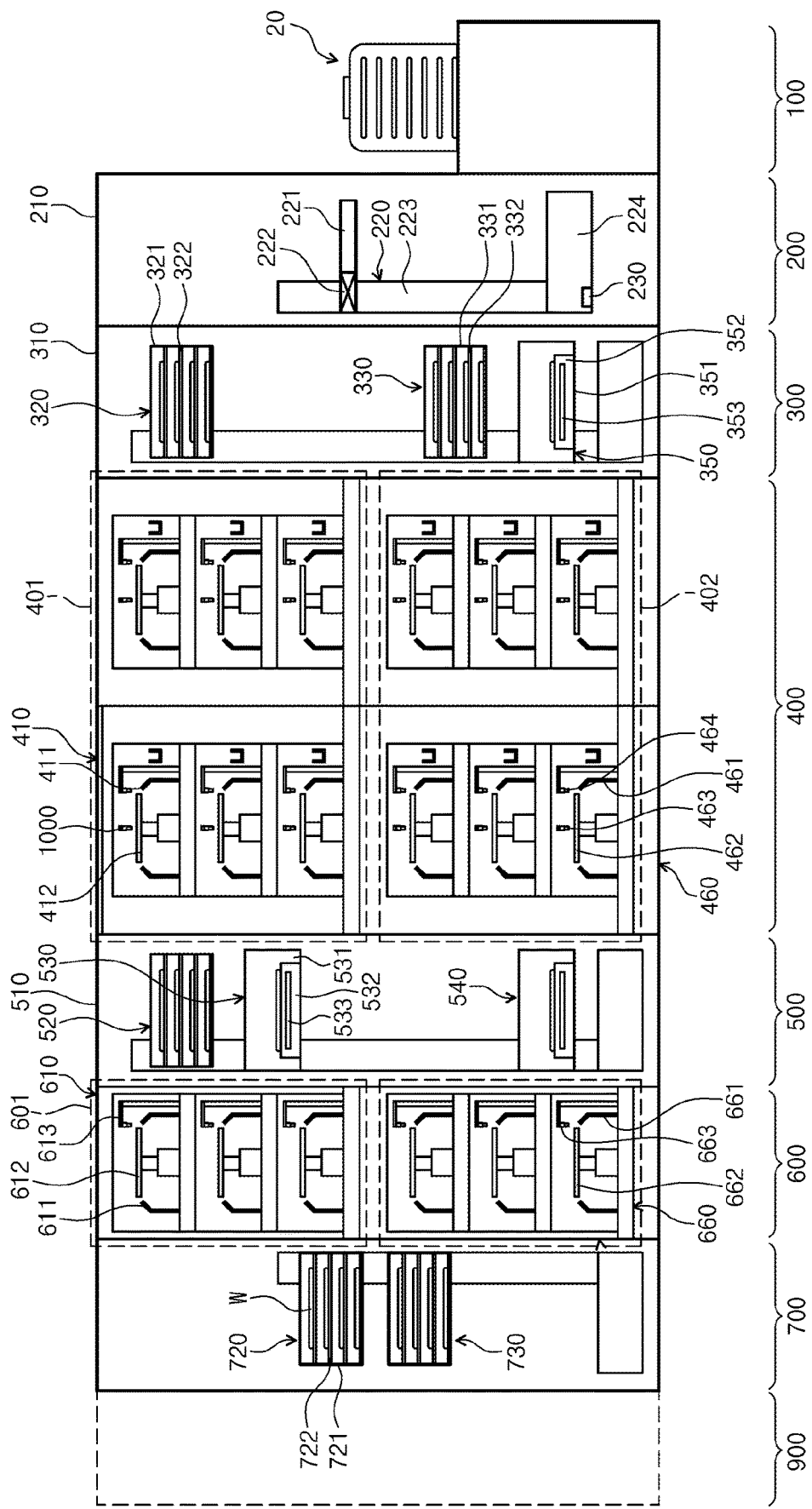
FIG. 2 is a view illustrating the substrate treating equipment of FIG. 1 when viewed in direction A-A.
Figure 3:
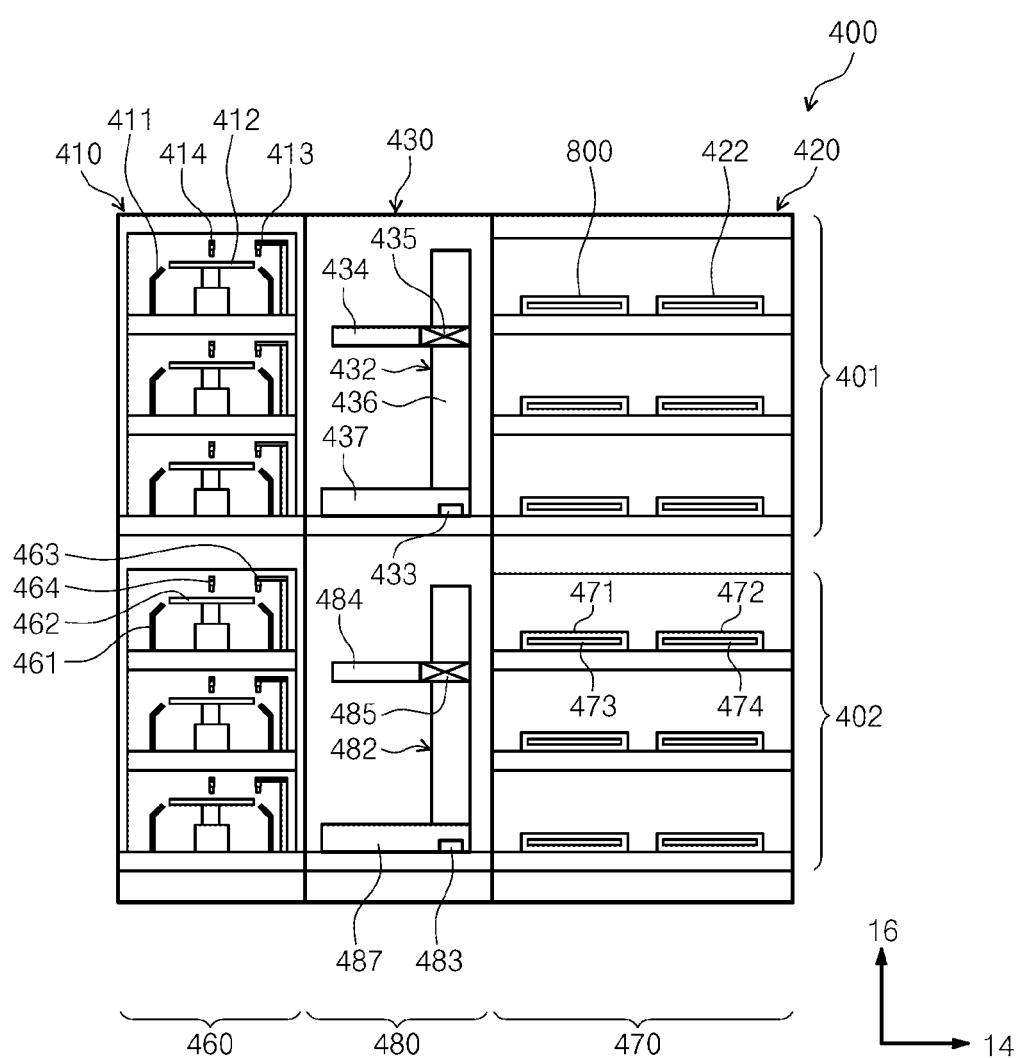
FIG. 3 is a view illustrating the substrate treating equipment of FIG. 1 when viewed in direction B-B.
Figure 4:
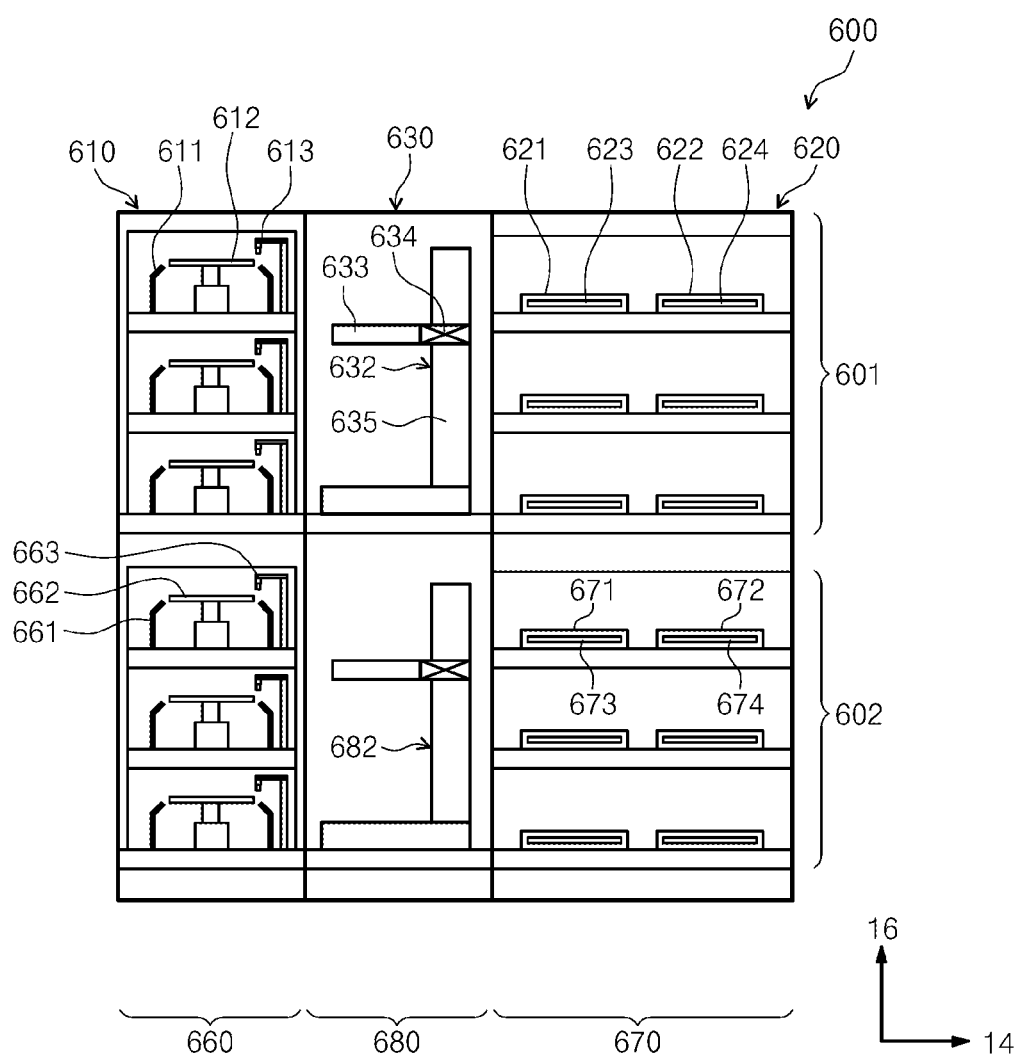
FIG. 4 is a view illustrating the substrate treating equipment of FIG. 1 when viewed in direction C-C.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Equipment of this embodiment may be used to perform a photolithography process on a substrate such as a semiconductor wafer or a flat display panel. In particular, the equipment of this embodiment may be connected to an exposing apparatus and may be used to perform a coating process and a developing process on a substrate. In the following description, it will be exemplified that a wafer is used as a substrate.

FIGS. 1 to 4 are schematic views illustrating substrate treating equipment according to an embodiment of the inventive concept.

Referring to FIGS. 1 to 4, the substrate treating equipment 1 includes a load port 100, an index module 200, a first buffer module 300, a coating and developing module 400, a second buffer module 500, a pre/post-exposure treatment module 600, and an interface module 700. The load port 100, the index module 200, the first buffer module 300, the coating and developing module 400, the second buffer module 500, the pre/post-exposure treatment module 600, and the interface module 700 are sequentially disposed in a row in one direction.

Hereinafter, a direction in which the load port 100, the index module 200, the first buffer module 300, the coating and developing module 400, the second buffer module 500, the pre/post-exposure treatment module 600, and the interface module 700 are disposed is referred to as a first direction 12. A direction perpendicular to the first direction 12 when viewed from above is referred to as a second direction 14, and a direction perpendicular to the first direction 12 and the second direction 14 is referred to as a third direction 16.

Substrates W are moved in a state of being received in cassettes 20. The cassettes 20 have a structure that can be sealed from the outside. For example, front open unified pods (FOUPs), each of which has a door at the front, may be used as the cassettes 20.

Hereinafter, the load port 100, the index module 200, the first buffer module 300, the coating and developing module 400, the second buffer module 500, the pre/post-exposure treatment module 600, and the interface module 700 will be described in detail.

The load port 100 have mounting tables 120 on which the cassettes 20 having the substrates W received therein are placed. The mounting tables 120 are disposed in a row along the second direction 14. In FIG. 1, four mounting tables 120 are provided.

The index module 200 transfers the substrates W between the cassettes 20 placed on the mounting tables 120 of the load port 100 and the first buffer module 300. The index module 200 has a frame 210, an index robot 220, and a guide rail 230. The frame 210 has a substantially rectangular parallelepiped shape with an empty space inside and is disposed between the load port 100 and the first buffer module 300. The frame 210 of the index module 200 may be provided in a lower position than a frame 310 of the first buffer module 300 that will be described below. The index robot 220 and the guide rail 230 are disposed in the frame 210. The index robot 220 has a structure capable of 4-axis driving such that a hand 221 for directly handling the substrates W is movable in the first direction 12, the second direction 14, and the third direction 16 and is rotatable. The index robot 220 has the hand 221, an arm 222, a support rod 223, and a base 224. The hand 221 is fixed to the arm 222. The arm 222 is provided in a retractable and rotatable structure. The support rod 223 is disposed such that the lengthwise direction thereof is parallel to the third direction 16. The arm 222 is coupled to the support rod 223 so as to be movable along the support rod 223. The support rod 223 is fixedly coupled to the base 224. The guide rail 230 is disposed such that the lengthwise direction thereof is parallel to the second direction 14. The base 224 is coupled to the guide rail 230 so as to be rectilinearly movable along the guide rail 230. Furthermore, although not illustrated, a door opener for opening/closing doors of the cassettes 20 is additionally provided in the frame 210.

The first buffer module 300 has the frame 310, a first buffer 320, a second buffer 330, a cooling chamber 350, and a first buffer robot 360. The frame 310 has a rectangular parallelepiped shape with an empty space inside and is disposed between the index module 200 and the coating and developing module 400. The first buffer 320, the second buffer 330, the cooling chamber 350, and the first buffer robot 360 are located in the frame 310. The cooling chamber 350, the second buffer 330, and the first buffer 320 are sequentially disposed along the third direction 16 from bottom to top. The first buffer 320 is located at the height corresponding to a coating module 401 of the coating and developing module 400 that will be described below, and the second buffer 330 and the cooling chamber 350 are located at the height corresponding to a developing module 402 of the coating and developing module 400 that will be described below. The first buffer robot 360 is located to be spaced apart from the second buffer 330, the cooling chamber 350, and the first buffer 320 by a predetermined distance in the second direction 14.

The first buffer 320 and the second buffer 330 each temporarily store a plurality of substrates W. The second buffer 330 has a housing 331 and a plurality of supports 332. The supports 332 are disposed in the housing 331 and are spaced apart from each other along the third direction 16. One substrate W is placed on each of the supports 332. The housing 331 has openings (not illustrated) that face the directions in which the index robot 220, the first buffer robot 360, and a developer robot 482 are provided, respectively, such that the index robot 220, the first buffer robot 360, and the developer robot 482 of the developing module 402, which will be described below, load the substrates W onto the supports 332 or unload the substrates W from the supports 332. The first buffer 320 has a structure substantially similar to that of the second buffer 330. However, a housing 321 of the first buffer 320 has openings that face the directions in which the first buffer robot 360 and a coater robot 432 located in the coating module 401 are provided, respectively. The number of supports 332 provided in the first buffer 320 may be the same as, or different from, the number of supports 332 provided in the second buffer 330. According to an embodiment, the number of supports 332 provided in the second buffer 330 may be larger than the number of supports 322 provided in the first buffer 320.

The first buffer robot 360 transfers the substrates W between the first buffer 320 and the second buffer 330. The first buffer robot 360 has a hand 361, an arm 362, and a support rod 363. The hand 361 is fixed to the arm 362. The arm 362 has a retractable structure and enables the hand 361 to move along the second direction 14. The arm 362 is coupled to the support rod 363 so as to be rectilinearly movable along the support rod 363 in the third direction 16. The support rod 363 has a length extending from the position corresponding to the second buffer 330 to the position corresponding to the first buffer 320. The support rod 363 may further extend upward or downward. The first buffer robot 360 may be provided such that the hand 361 simply performs only 2-axis driving along the second direction 14 and the third direction 16.

The cooling chamber 350 cools the substrates W. The cooling chamber 350 has a housing 351 and a cooling plate 352. The cooling plate 352 has an upper surface on which the substrate W is placed and a cooling unit 353 that cools the substrate W. Various methods, such as cooling by cooling water, cooling by a thermoelectric element, and the like, may be used for the cooling unit 353. Furthermore, the cooling chamber 350 may include a lift pin assembly (not illustrated) that locates the substrate W on the cooling plate 352. The housing 351 has openings (not illustrated) that face the directions in which the index robot 220 and the developer robot 482 are provided, respectively, such that the index robot 220 and the developer robot 482 provided in the developing module 402 load the substrate W onto the cooling plate 352 or unload the substrate W from the cooling plate 352. In addition, the cooling chamber 350 may include doors (not illustrated) that open or close the openings described above.

The coating and developing module 400 performs a process of coating the substrates W with photoresist before an exposing process and performs a developing process on the substrates W after the exposing process. The coating and developing module 400 has a substantially rectangular parallelepiped shape. The coating and developing module 400 has a coating module 401 and a developing module 402. The coating module 401 and the developing module 402 may be disposed on different floors so as to be divided from each other. According to an embodiment, the coating module 401 is located over the developing module 402.

The coating module 401 performs a process of coating the substrate W with a light-sensitive material such as photoresist and performs a heat treatment process, such as heating or cooling, on the substrate W before and after the photoresist coating process. The coating module 401 has photoresist coating chambers 410, bake units 420, and a transfer chamber 430. The photoresist coating chambers 410, the bake units 420, and the transfer chamber 430 are sequentially disposed along the second direction 14. Accordingly, the photoresist coating chambers 410 and the bake units 420 are spaced apart from each other in the second direction 14, with the transfer chamber 430 therebetween. The photoresist coating chambers 410 are arranged in the first direction 12 and the third direction 16. The drawings illustrate one example that six photoresist coating chambers 410 are provided. The bake units 420 are arranged in the first direction 12 and the third direction 16. The drawings illustrate one example that six bake units 420 are provided. However, a larger number of bake units 420 may be provided.

The transfer chamber 430 is located side by side with the first buffer 320 of the first buffer module 300 in the first direction 12. The coater robot 432 and a guide rail 433 are located in the transfer chamber 430. The transfer chamber 430 has a substantially rectangular shape. The coater robot 432 transfers the substrate W between the bake units 420, the photoresist coating chambers 400, the first buffer 320 of the first buffer module 300, and a first cooling chamber 520 of the second buffer module 500 that will be described below. The guide rail 433 is disposed such that the lengthwise direction thereof is parallel to the first direction 12. The guide rail 433 guides a rectilinear movement of the coater robot 432 in the first direction 12. The coater robot 432 has a hand 434, an arm 435, a support rod 436, and a base 437. The hand 434 is fixed to the arm 435. The arm 435 has a retractable structure and enables the hand 434 to move in the horizontal direction. The support rod 436 is disposed such that the lengthwise direction thereof is parallel to the third direction 16. The arm 435 is coupled to the support rod 436 so as to be rectilinearly movable along the support rod 463 in the third direction 16. The support rod 436 is fixedly coupled to the base 437, and the base 437 is coupled to the guide rail 433 so as to be movable along the guide rail 433.

The photoresist coating chambers 410 all have the same structure. However, the types of photoresists used in the respective photoresist coating chambers 410 may differ from one another. For example, chemical amplification resist may be used as photoresist. Each of the photoresist coating chambers 410 coats the substrate W with photoresist. The photoresist coating chamber 410 has a housing 411, a support plate 412, and a nozzle 413. The housing 411 has a cup shape with an open top. The support plate 412 is located in the housing 411 and supports the substrate W. The support plate 412 is provided so as to be rotatable. The nozzle 413 dispenses the photoresist onto the substrate W placed on the support plate 412. The nozzle 413 may have a circular tubular shape and may dispense the photoresist onto the center of the substrate W. Selectively, the nozzle 413 may have a length corresponding to the diameter of the substrate W, and a dispensing opening of the nozzle 413 may have a slit shape. Additionally, the photoresist coating chamber 410 may further include a nozzle 414 for dispensing a cleaning solution such as deionized water to clean the surface of the substrate W that is coated with the photoresist.

The bake units 420 may perform heat treatment on the substrate W. For example, the bake units 420 perform a prebake process of removing organics or moisture on the surface of the substrate W by heating the substrate W to a predetermined temperature before the substrate W is coated with the photoresist, or perform a soft bake process after the substrate W is coated with the photoresist. In addition, the bake units 420 perform a cooling process of cooling the substrate W after the heating processes.

Figure 5:
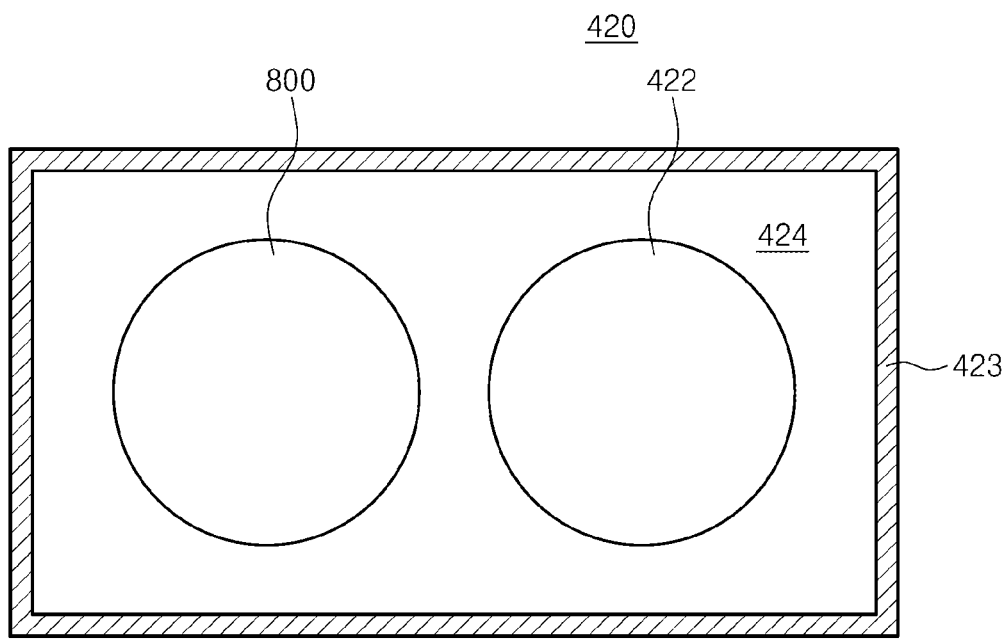
FIG. 5 is a plan view illustrating a bake unit according to an embodiment of the inventive concept.
Figure 6:
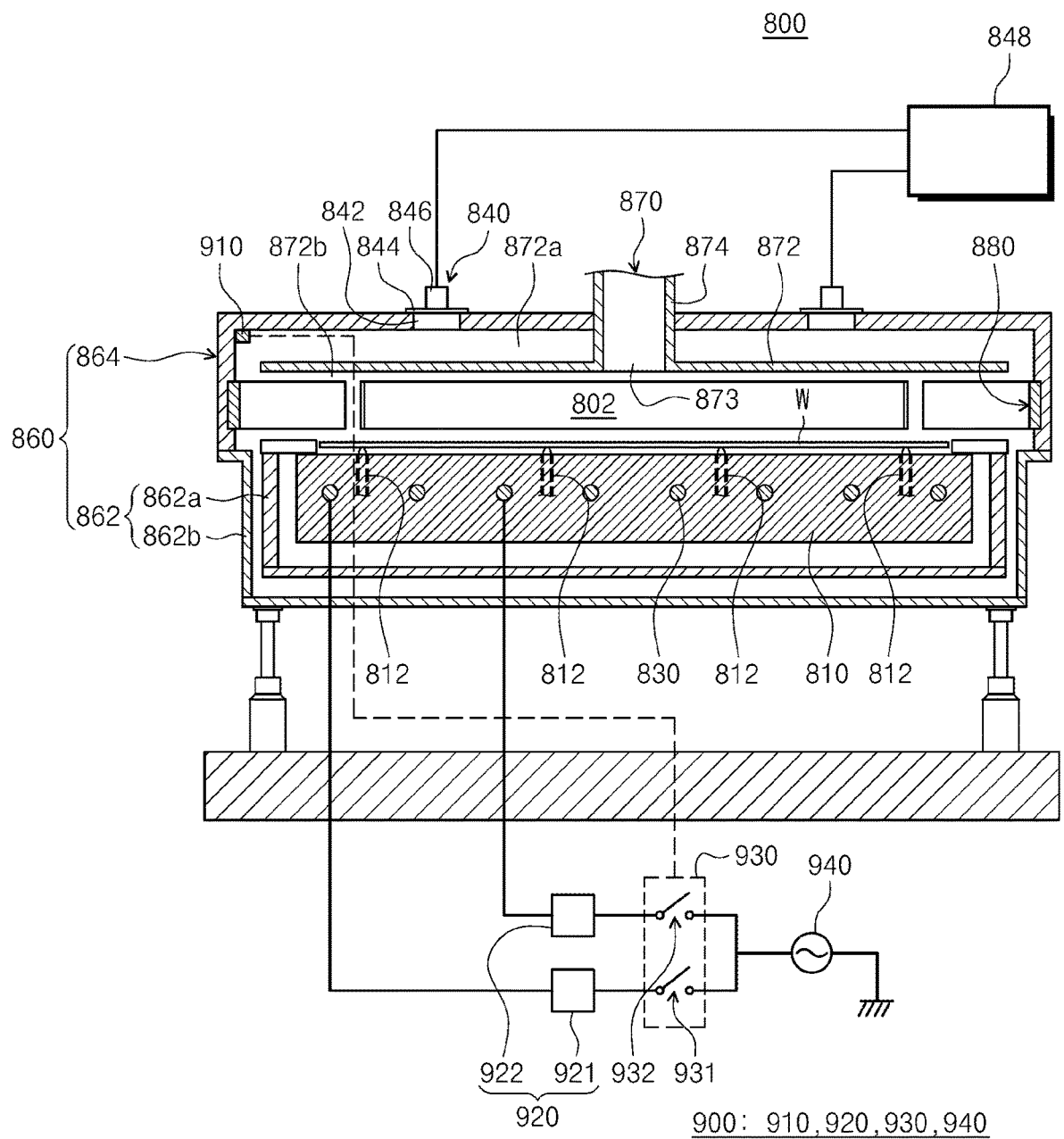
FIG. 6 is a sectional view illustrating a substrate treating apparatus according to an embodiment of the inventive concept.

FIG. 5 is a plan view illustrating a bake unit according to an embodiment of the inventive concept, and FIG. 6 is a sectional view illustrating a heating unit for performing a heating process in the bake unit of FIG. 5.

Referring to FIGS. 5 and 6, the bake unit 420 may include a process chamber 423, a cooling plate 422, and the heating unit 800. A substrate treating apparatus of the inventive concept may be the heating unit 800. Hereinafter, the heating unit 800 is referred to as the substrate treating apparatus 800.

The process chamber 423 has a heat treatment space 424 therein. The process chamber 423 may have a rectangular parallelepiped shape. The cooling plate 422 may cool the substrate W heated by the substrate treating apparatus 800. The cooling plate 422 may be located in the heat treatment space 424. The cooling plate 422 may have a circular plate shape. A cooling means, such as cooling water or a thermoelectric element, is provided inside the cooling plate 422. For example, the cooling plate 422 may cool the heated substrate W to room temperature.

The substrate treating apparatus 800 performs heat treatment on the substrate W. The substrate treating apparatus 800 may include a housing 860, a heating plate 810, a heating member 830, an external gas supply unit 840, a heater 880, an exhaust member 870, and a temperature control unit 900.

The housing 860 has a treatment space 802 in which a heating process is performed on the substrate W. The housing 860 includes a lower body 862, an upper body 864, and an actuator (not illustrated). The lower body 862 may have a container shape that is open at the top. The heating plate 810 and the heating member 830 are located in the lower body 862. The lower body 862 includes double heat-insulating covers 862a and 862b to prevent thermal deformation of devices located around the heating plate 810. The double heat-insulating covers 862a and 862b minimize exposure of the devices around the heating plate 810 to high-temperature heat generated from the heating member 830. The double heat-insulating covers 862a and 862b include the primary heat-insulating cover 862a and the secondary heat-insulating cover 862b. The primary heat-insulating cover 862a and the secondary heat-insulating cover 862b are spaced apart from each other.

The upper body 864 has a container shape that is open at the bottom. The upper body 864 is combined with the lower body 862 to form the treatment space 802 inside. The upper body 864 has a larger diameter than the lower body 862. The upper body 864 is located over the lower body 862. The upper body 864 is movable in an up-down direction by the actuator. The upper body 864 is vertically movable to a raised position and a lowered position. Here, the raised position is a position in which the upper body 864 is separated from the lower body 862, and the lowered position is a position in which the upper body 864 is brought into contact with the lower body 862. In the lowered position, the gap between the upper body 864 and the lower body 862 is blocked. Accordingly, when the upper body 864 is moved to the lowered position, the treatment space 802 is formed by the upper body 864, the lower body 862, and the heating plate 810.

Although not illustrated, sealing members for preventing introduction of external air into the treatment space 802 may be included in the housing 860. For example, the sealing members may seal the gap between the lower body 862 and the upper body 864.

The heating plate 810 is located in the treatment space 802. The heating plate 810 is located on one side of the cooling plate 422. The heating plate 810 has a circular plate shape. An upper surface of the heating plate 810 serves as a support region on which the substrate W is placed. The heating plate 810 has a plurality of pin holes 812 formed in the upper surface thereof. For example, three pin holes 812 may be provided. The pin holes 812 are located to be spaced apart from each other along the circumferential direction of the heating plate 810. The pin holes 812 are located to be spaced apart from each other at the same intervals. Lift pins (not illustrated) are provided in the pin holes 812, respectively. The lift pins are movable in the up-down direction by a drive member (not illustrated). The heating member 810 may have the heating member 830 inside.

The heating member 830 heats the substrate W placed on the heating plate 810 to a preset temperature. A plurality of heating members 830 may be provided in different regions of the heating plate 810 to perform heat treatment on respective regions of the substrate W.

Figure 8:
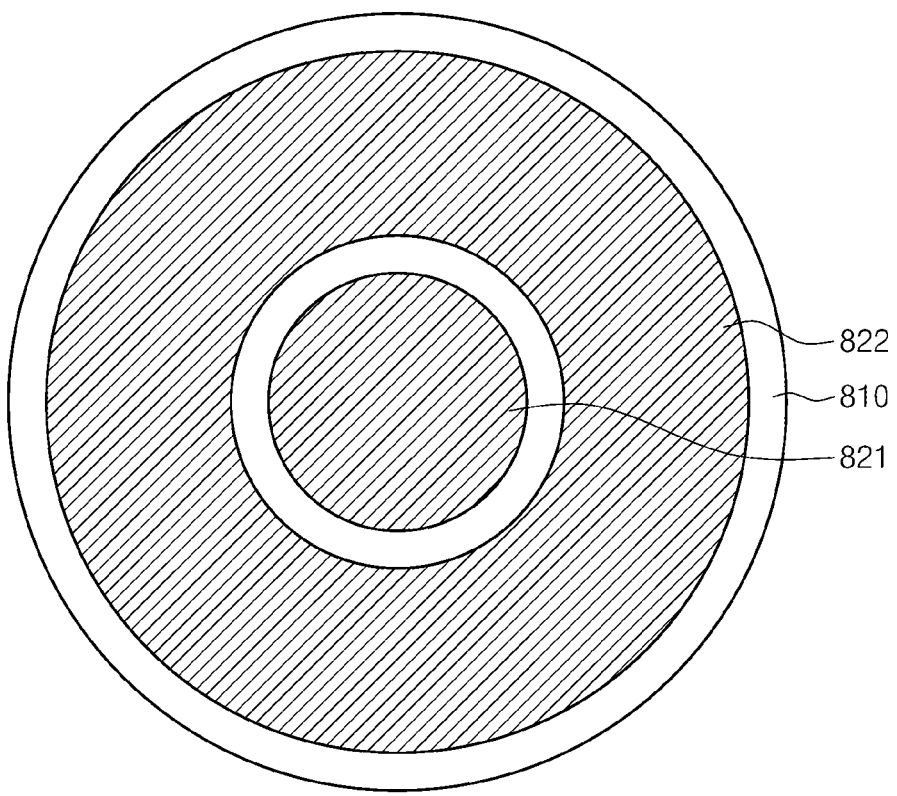
FIGS. 8 and 9 are sectional views illustrating a plurality of regions of a heating plate according to various embodiments of the inventive concept.

The temperature control unit 900 may control the plurality of heating members 830 provided inside the heating plate 810. The temperature control unit 900 may control the plurality of heating members 830 using a plurality of control signals with different control periods. Specifically, the temperature control unit 900 may include a temperature measurement member 910, a controller 920, a switching member 930, and a power supply 940. The temperature measurement member 910 may measure temperatures for respective regions of the heating plate 810. Referring to FIG. 8, for example, the heating plate 810 may include a central region 821 and an edge region 822. In this case, the plurality of heating members 830 may include a first heating member provided in the central region 821 and a second heating member provided in the edge region 822. Furthermore, the controller 920 may include a first controller 922 and a second controller 921. The first controller 922 may be connected to the first heating member and may control the temperature of the central region 821 of the heating plate 810. The second controller 921 may be connected to the second heating member and may control the temperature of the edge region 822 of the heating plate 810. The first controller 922 and the second controller 921 may control the temperatures for the respective regions of the heating plate 810 by controlling the first heating member and the second heating member, based on the temperatures of the central region 821 and the edge region 822 that are measured by the temperature measurement member 910. At this time, a control period of the first controller 922 and a control period of the second controller 921 may differ from each other. In a case where the control period of the first controller 922 is shorter than the control period of the second controller 921, the first controller 922 may more rapidly cope with a change in the temperature of the central region 821 of the heating plate 810 that is controlled by the first controller 922. That is, as power per unit area applied to the central region 821 of the heating plate 810 is lower than that applied to the edge region 822 of the heating plate 810, the temperature of the central region 821 may be more rapidly changed by contact with the substrate W than the temperature of the edge region 822. Accordingly, by controlling the control period of the first controller 922 to be relatively short, temperature control may be more effectively performed in the central region 821 of the heating plate 810 that experiences a relatively rapid temperature change. Furthermore, the switching member 930 may be provided between the controller 920 and the power supply 940 and may connect or disconnect the controller 920 and the power supply 940 depending on the temperatures of the respective regions of the heating plate 810 that are measured by the temperature measurement member 910. In this case, the control periods of the first controller 922 and the second controller 921 may be set in advance. The switching member 930 may include a first switch 932 provided between the first controller 922 and the power supply 940 and a second switch 931 provided between the second controller 921 and the power supply 940.

Alternatively, the first controller 922 and the second controller 921 may be provided such that the control periods thereof are variable. That is, the first controller 922 and the second controller 921 may frequently change the control periods thereof, and the control periods of the first controller 922 and the second controller 921 may be changed based on temperatures measured by the temperature measurement member 910. For example, the control periods of the first controller 922 and the second controller 921 may be changed to be shorter in a dynamic section in which temperature changes measured by the temperature measurement member 910 exceed a preset range. That is, when the temperature of the heating plate 810 is rapidly changed as in a case where the substrate W is seated on the heating plate 810, the control periods of the first controller 922 and the second controller 921 may be changed to be shorter, and thus the first controller 922 and the second controller 921 may effectively cope with the temperature change. In another example, the control periods of the first controller 922 and the second controller 921 may be changed to be longer in a static section in which the temperature changes measured by the temperature measurement member 910 are below the preset range. As described above, the control periods of the first controller 922 and the second controller 921 may be changed depending on the temperature changes measured by the temperature measurement member 910, and thus the temperatures for the respective regions of the heating plate 810 may be more effectively controlled.

Figure 7:
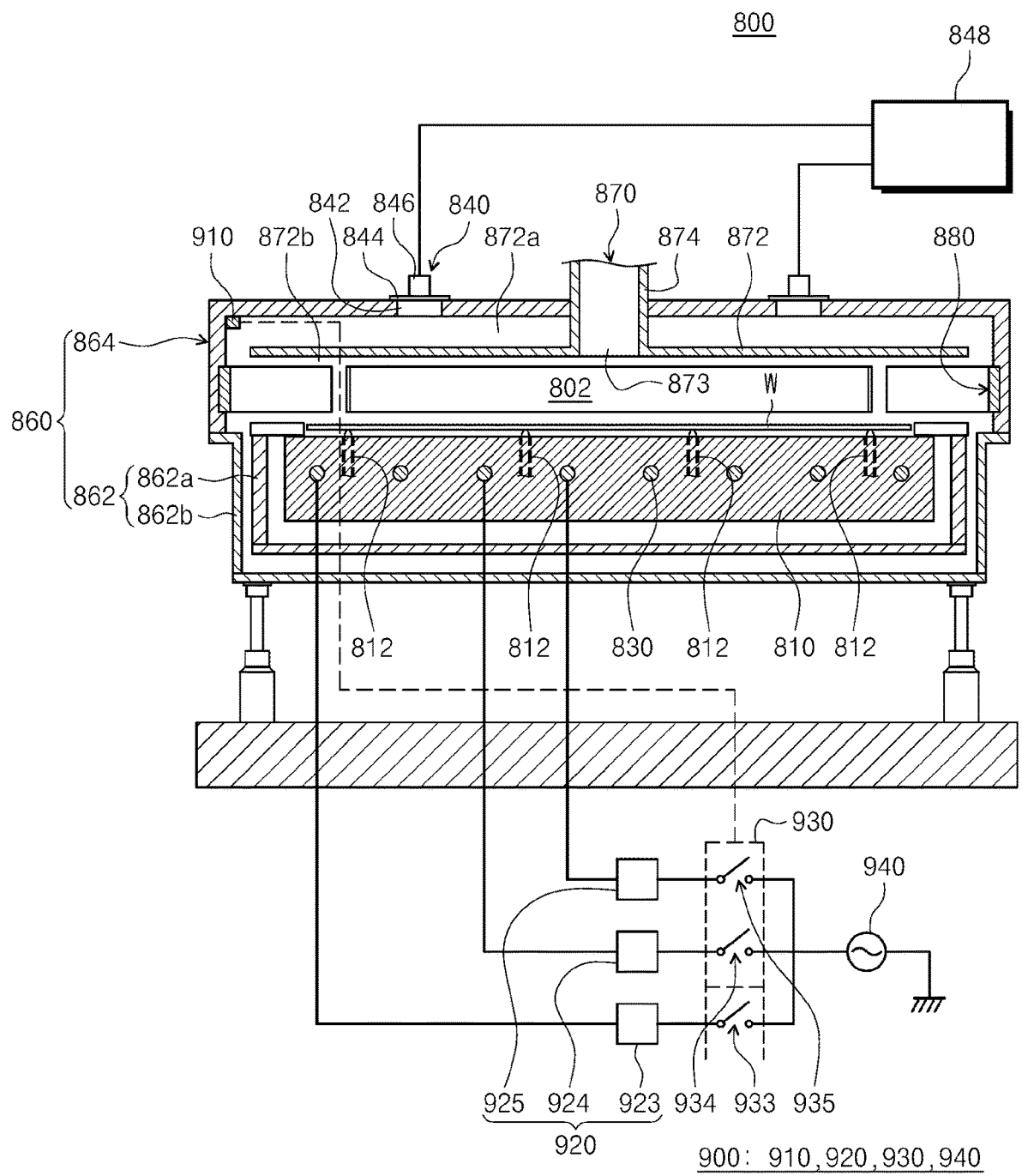
FIG. 7 is a sectional view illustrating a substrate treating apparatus according to another embodiment of the inventive concept.
Figure 9:
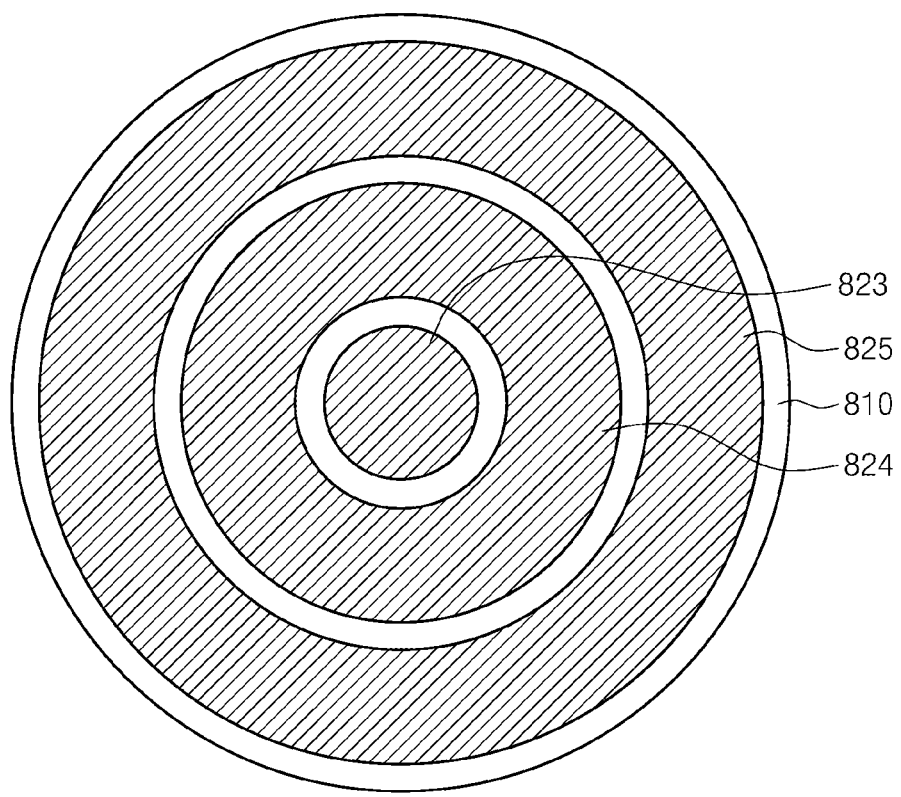

Referring to FIG. 7, a controller 920 may include a third controller 925, a fourth controller 924, and a fifth controller 923. As illustrated in FIG. 9, a heating plate 810 may include a central region 823, a middle region 824, and an edge region 825. A heating member 830 may include a third heating member provided in the central region 823, a fourth heating member provided in the middle region 824, and a fifth heating member provided in the edge region 825. In this case, the third controller 925, the fourth controller 924, and the fifth controller 923 may control the third heating member, the fourth heating member, and the fifth heating member, respectively. Control periods of the third controller 925, the fourth controller 924, and the fifth controller 923 may differ from one another. For example, the control period of the third controller 925 may be shorter than the control period of the fourth controller 924, and the control period of the fourth controller 924 may be shorter than the control period of the fifth controller 923. That is, the control period of the third controller 925 that controls the temperature of the central region 823 that experiences a great temperature change due to relatively low power per unit area may be shortest, and the control period of the fifth controller 923 that controls the temperature of the edge region 825 that experiences a small temperature change due to relatively high power per unit area may be longest. Accordingly, the temperatures for the respective regions of the heating plate 810 may be more effectively controlled.

Figure 10:
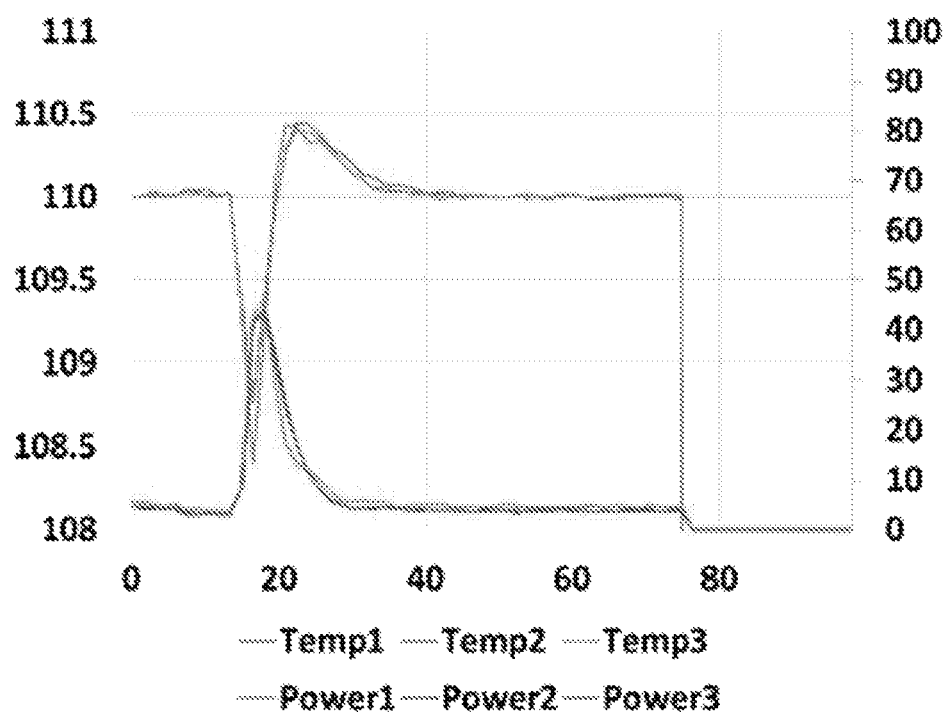
FIGS. 10 and 11 are graphs depicting temperature changes for respective regions of a heating plate according to an embodiment of the inventive concept.
Figure 11:
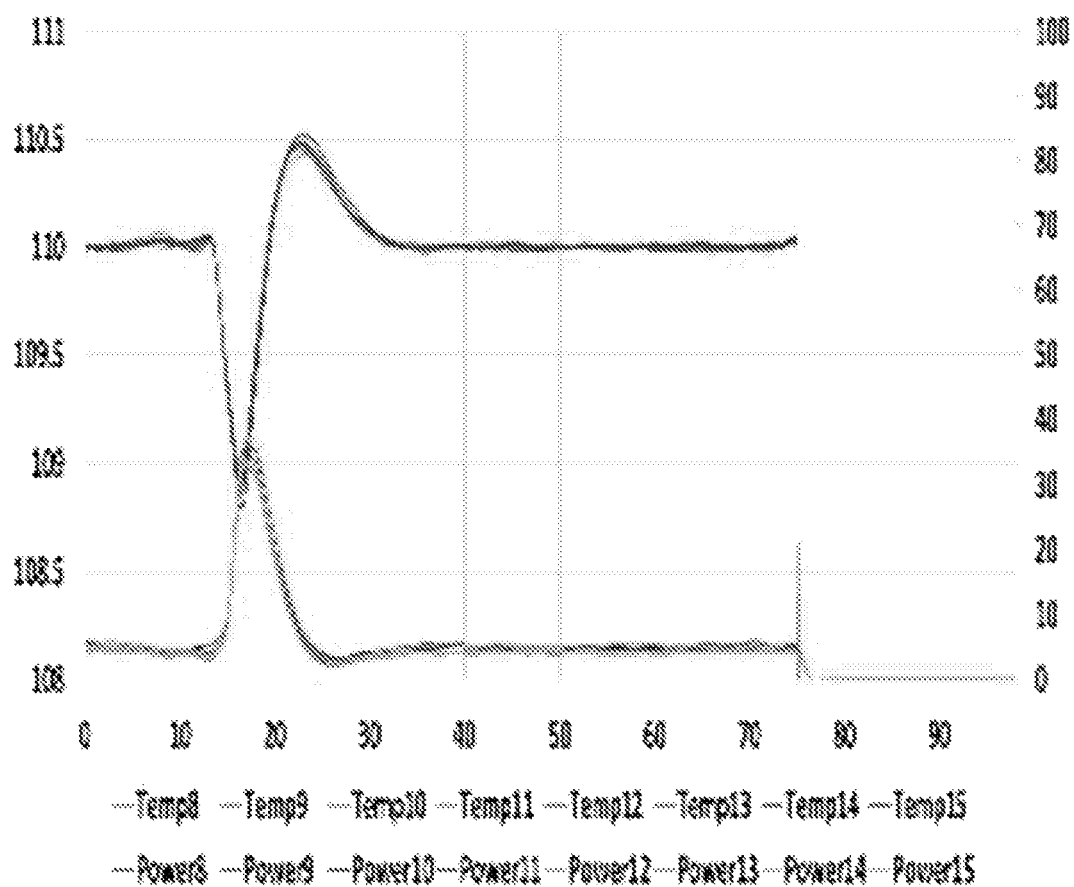

FIGS. 10 and 11 are graphs depicting temperature changes for respective regions of a heating plate according to an embodiment of the inventive concept. In FIGS. 10 and 11, the X-axis represents time, and the Y-axis represents temperature and power. Referring to FIGS. 10 and 11, when a substrate is seated on the heating plate 810, power applied to the heating plate 810 rises to raise the temperature of the heating plate 810, and when the temperature of the heating plate 810 reaches an appropriate temperature, the power applied to the heating plate 810 is maintained in the state prior to the rise again. In this case, the temperature of the heating plate 810 may be more effectively controlled by differently providing the control periods of the plurality of controllers 920 that control the temperatures for the respective regions of the heating plate 810.

Figure 12:
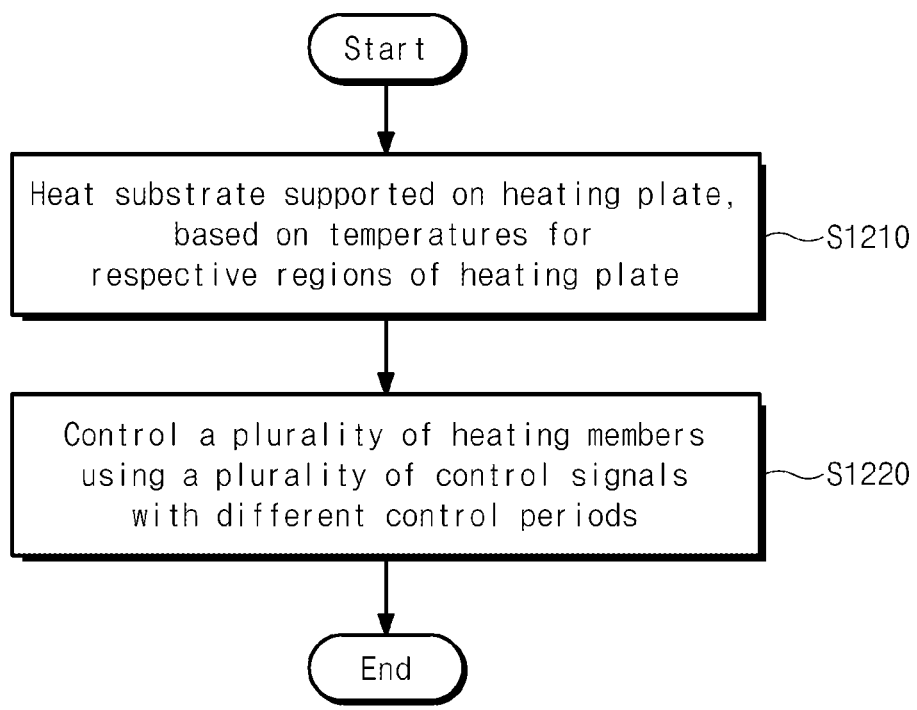
FIG. 12 is a flowchart illustrating a substrate treating method according to an embodiment of the inventive concept.

FIG. 12 is a flowchart illustrating a substrate treating method according to an embodiment of the inventive concept.

Referring to FIG. 12, a substrate supported on a heating plate is heated based on temperatures for respective regions of the heating plate (S1210). In this case, a plurality of heating members may be controlled by using a plurality of control signals with different control periods. A control period of a control signal supplied to a first heating member provided in a central region of the heating plate may differ from a control period of a control signal supplied to a second heating member provided in an edge region surrounding the central region. Specifically, the control period of the control signal supplied to the first heating member may be shorter than the control period of the control signal supplied to the second heating member. For example, the control periods of the plurality of control signals supplied to the plurality of heating members may be changed to be shorter in a dynamic section in which temperature changes measured by a temperature measurement member exceed a preset range. In another example, the control periods of the plurality of control signals supplied to the plurality of heating members may be changed to be longer in a static section in which the temperature changes measured by the temperature measurement member are below the preset range.

As described above, according to the various embodiments of the inventive concept, the temperatures for the respective regions of the heating plate may be more effectively controlled by controlling the regions of the heating plate with different control periods.

As described above, according to the various embodiments of the inventive concept, the temperature of a substrate may be more effectively controlled by controlling regions of a heating plate with different control periods.

In addition, temperature hunting may be prevented in the heating plate.

Effects of the inventive concept are not limited to the aforementioned effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a housing having a treatment space therein;
   a heating plate configured to support the substrate in the treatment space, the heating plate having a plurality of heating members inside; and
   a temperature control unit configured to control the plurality of heating members to heat the substrate supported on the heating plate, wherein the temperature control unit controls the plurality of heating members using a plurality of control signals with different control periods, wherein the plurality of heating members includes a first heating member and a second heating member,
   wherein the temperature control unit includes:
   a first controller configured to generate a first control signal of the control signals to control the first heating member;
   a second controller configured to generate a second control signal of the control signals to control the second heating member;
   a temperature measurement member configured to measure temperatures for respective regions of the heating plate; and
   a switching member configured to control connection or disconnection between a power supply and the first and second controllers, based on the temperatures measured by the temperature measurement member,
   wherein the first controller is connected to the second controller through the switching member,
   wherein the heating plate includes a central region and an edge region surrounding the central region,
   wherein the first heating member is provided in the central region and the second heating member is provided in the edge region,
   wherein the first controller and the second controller are provided such that the control periods thereof are variable,
   wherein the control periods of the first controller and the second controller are changed to be shorter in a dynamic section in which temperature changes measured by the temperature measurement member exceed a preset range, and
   wherein the control periods of the first controller and the second controller are changed to be longer in a static section in which temperature changes measured by the temperature measurement member are below a preset range.

2. The apparatus of claim 1, wherein each of the first controller and the second controller is directly connected to output terminals of the switching member independent of the temperature measurement member, and the power supply is directly connected to input terminals of the switching member.

3. The apparatus of claim 1, wherein the temperature control unit further includes:
   the power supply configured to supply the power to the plurality of heating members, and
   wherein the power supply is connected to each of the first controller and the second controller through the switching member.

4. The apparatus of claim 1, wherein the apparatus is an apparatus configured to perform a bake process.

5. A heating unit comprising:
   a heating plate configured to support a substrate, the heating plate having a plurality of heating members inside; and
   a temperature control unit configured to control the plurality of heating members to heat the substrate supported on the heating plate, wherein the temperature control unit controls the plurality of heating members using a plurality of control signals with different control periods, wherein the plurality of heating members includes a first heating member and a second heating member,
   wherein the temperature control unit includes:
   a first controller configured to generate a first control signal of the control signals to control the first heating member;
   a second controller configured to generate a second control signal of the control signals to control the second heating member, the first control signal having a control period different from a control period of the second control signal;

a temperature measurement member configured to measure temperatures for respective regions of the heating plate; and a switching member configured to control connection or disconnection between a power supply and the first and second controllers, based on the temperatures measured by the temperature measurement member, wherein the first controller is connected to the second controller through the switching member, wherein the heating plate includes a central region and an edge region surrounding the central region, wherein the first heating member is provided in the central region and the second heating member is provided in the edge region, wherein the control period of the first control signal of the first controller is shorter than the control period of the second control signal of the second controller, wherein the first controller and the second controller are provided such that the control periods thereof are variable, wherein the control periods of the first controller and the second controller are changed to be shorter in a dynamic section in which temperature changes measured by the temperature measurement member exceed a preset range, and wherein the control periods of the first controller and the second controller are changed to be longer in a static section in which temperature changes measured by the temperature measurement member are below a preset range.

6. The heating unit of claim 5, wherein each of the first controller and the second controller is directly connected to output terminals of the switching member independent of the temperature measurement member, and the power supply is directly connected to input terminals of the switching member.

* * * * *